United States Patent [19]

Brewer

[11] 4,383,185

[45] May 10, 1983

[54] SWITCHABLE ANALOG SIGNAL INVERTER

[75] Inventor: Robert J. Brewer, Lyndhurst, England

[73] Assignee: U.S. Philips Corporation, New York, N.Y.

[21] Appl. No.: 301,157

[22] Filed: Sep. 11, 1981

[30] Foreign Application Priority Data

Sep. 19, 1980 [GB] United Kingdom ............... 8030316

[51] Int. Cl.³ ................................................ H03K 3/00
[52] U.S. Cl. ..................................................... 307/108
[58] Field of Search ................................. 307/108, 113

[56] References Cited

U.S. PATENT DOCUMENTS

| | | | |
|---|---|---|---|
| 2,702,855 | 2/1955 | Bess | 307/108 X |
| 2,889,470 | 6/1959 | Gray et al. | 307/108 |
| 3,419,784 | 12/1968 | Winn | 307/108 X |
| 3,793,533 | 2/1974 | Ginsberg | 307/113 |

Primary Examiner—Donald A. Griffin
Attorney, Agent, or Firm—Thomas A. Briody; Robert T. Mayer; Steven R. Biren

[57] ABSTRACT

A switchable analog signal inverter is suitable for inverting an input D.C. voltage, for example the D.C. voltage from a digital to analog converter (DAC), thereby halving the size of the DAC. The inverter includes a capacitor having one side alternately switchable between a reference voltage point and an output terminal and another side alternately switchable between the reference voltage point and an input signal terminal, and switching means for selectively reversing the phasing of the switching between the reference voltage and the input signal. In one embodiment the inverter comprises a double pole reversing switch having inputs connected to a signal input terminal and to a reference voltage point and a capacitor connected by a change-over switch to first and second outputs of the reversing switch and by another change-over switch to a signal output terminal or to the reference voltage point. The reversing switch is operable in response to a polarity change signal to reverse the signal applied to the first and second outputs and thereby determine the polarity of the voltage pumped by the capacitor to the output terminal by clocking the change-over switches. The switches may be implemented by field effect transistors.

9 Claims, 8 Drawing Figures

SWITCHABLE ANALOG SIGNAL INVERTER

BACKGROUND OF THE INVENTION

The present invention relates to a switchable analogue signal inverter.

There are certain applications where it is required to produce an output analog signal having a particular one of two opposite polarities, in order to do this it has been necessary to provide a signal capable of assuming both of these polarities and then select the desired polarity signal to pass to an output. In the case of a digital to analog converter it is generally necessary to construct it so that it is able to produce both positive and negative voltages. This means that a dual-polarity DAC has to use twice as many components and occupy a relatively large area of an integrated circuit chip as compared to a single-polarity DAC. Further, it is not always convenient to provide busses carrying positive and negative voltages particularly in the case of an integrated circuit.

Chopper type inverters are well known in the art. By way of example, U.S. Patent Specification Ser. No. 2,889,470 discloses a type of inverter in which in a first instant a first capacitor is charged by an input d.c. voltage via a chopper type inverting switch whose contact(s) are in a first position, and in a second instant, when the inverting switch has been actuated so that its contact(s) are in a second position, the charge on the first capacitor is inverted and shared with a second capacitor of much larger (seven times) capacitance. The cycle of charging the first capacitor and sharing its charge with the second capacitor is continued as long as desired. Assuming that the input d.c. voltage is contant, then the voltage across the second capacitor reaches the inverted value of the input voltage after several cycles. This is because of the sharing of charge between the first and second capacitors. Thus, such an inverter is unable to track rapid changes in input voltage. Such an inverter, with its relatively large capacitors, is also not suited for high speed switching operations and for implementation as an integrated circuit.

Also known (see British Patent Specification No. 2,038,577A) is a bipolar pulse code modulation (PCM) decoder in which in response to a polarity signal in a received PCM signal, the polarity of a single polarity voltage source is set to that it is either positive or negative. Then as each linear digit of a coded value is decoded, in a first instant a first capacitor is charged or held discharged, depending on the binary value of the digit, and in a second instant the charge on the first capacitor, if present, is shared with a second capacitor which serves as a store for the charge contributions from the first capacitor. The cycle is repeated for the remaining linear digits. Thereafter, the first capacitor is discharged, and in response to segment code digits the charge on the second capacitor is shared with the first capacitor, which is discharged so that after the last segment digit the voltage remaining on the second capacitor represents the output analog voltage. The capacitors are then discharged in readiness for the next coded value to be decoded. This again represents another example of charge sharing requiring two capacitors and their inherent delay.

SUMMARY OF THE INVENTION

Accordingly, it is an object of the present invention to provide an inverter whose polarity can be switched at will and which avoids the need for charge sharing between two capacitors.

According to the present invention there is provided a switchable analog signal inverter comprising a single capacitance having a first side alternately switchable at a clock frequency between a reference voltage point and an output and a second side alternately switchable at the clock frequency between the reference voltage point and an input to which a unipolarity voltage is applied in use, and switching means responsive to a polarity select signal for selectively determining the phasing of the switching between the reference voltage point and input signal, and thereby the polarity of the voltage at the output.

By means of a switchable analog signal inverter in accordance with the present invention, this circuit is able to invert a unipolarity signal when required to provide an output of the opposite polarity. Thus, the need to provide a bipolar input signal is avoided. Furthermore, by embodying a single capacitance in the inverter, the problems of two capacitors and charge sharing are avoided.

In one embodiment of the present invention said switching means comprises a double pole reversing switch having inputs connected to the input terminal and to the reference voltage point and first and second outputs, the second side of the capacitance is switchable between one or other of said first and second outputs on alternate half cycles of a clock signal and the first side is switchable between the output terminal and the reference voltage point on alternate half cycles of the clock signal, the reversing switch being operable in response to a polarity change signal to reverse the signals on the first and second outputs and thereby determine the polarity of the voltage appearing on the output terminal.

In another embodiment of the present invention the second side of the capacitance is connected to the junction of the outputs of first and second change-over switches which are operable in response to a polarity select signal, the inputs of the first switch being connectable via, third change-over switch operable at a clock frequency to the input terminal and the inputs of the second switch being connectable via a fourth change-over switch operable at the clock frequency to the reference voltage point.

BRIEF DESCRIPTION OF THE DRAWING

The present invention will now be described, by way of example, with reference to the accompanying drawing, wherein.

DETAILED DESCRIPTION

Figure 1:
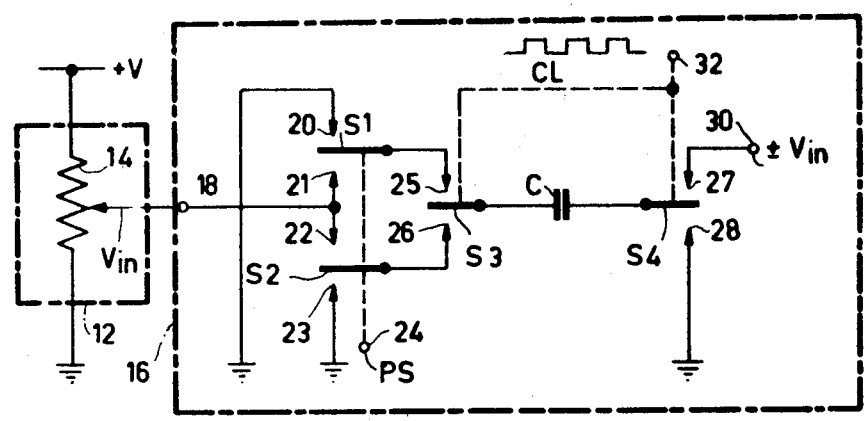
FIG. 1 is a diagram showing one embodiment of the switchable analog signal inverter made in accordance with the present invention connected to the output of a digital-to-analog converter (DAC) represented as a potentiometer.

Referring initially to FIG. 1, the drawing shows a DAC 12 represented by a potentiometer 14 whose variable tapping is connected to an input terminal 18 of a switchable analog signal inverter 16. The input terminal 18 is connected to fixed contacts 21, 22 of first and second change-over switches S1 and S2 whose moving contacts are ganged together and are controlled by a polarity select signal PS applied to a terminal 24. The other fixed contacts 20, 23 of the switches S1 and S2 are connected to a point of reference potential which point in the illustrated embodiments comprises ground. With the switches S1 and S2 connected as described they form a double pole reversing switch. The outputs of the switches S1 and S2 are connected to respective fixed contacts 25, 26 of a third change-over switch S3 whose moving contact is connected to one side of a capacitor C whose other side is connected to the moving contact of a fourth change-over switch S4. The fixed contacts 27 and 28 are connected respectively to an output terminal 30 and to ground. The switches S2 and S4 are operated in synchronism on opposite half cycles of a clock signal CL applied to a terminal 32.

In FIG. 1 it is desired to produce at the output terminal an analog voltage which can vary between $\pm V$ volts, for example $\pm 2.5$ volts, using an analog input signal varying between O and V volts applied to the input terminal 18 and inverting it when required. The analog input signal in the illustrated embodiment is derived from the DAC 12, which need only be half the size or use half the components of a DAC which is intended to produce an output which can vary from $+V$ to $-V$ volts; in other words, by being able to invert the voltage from the DAC 12 when required it is only necessary to provide a unidirectionally varying analog signal at the input terminal 18. In order to maintain the linearity of the signal it is necessary that the overall gain of the inverter 16 be plus unity or minus unity.

The required polarity of the output analog voltage on the terminal 30 is determined by the setting of the switches S1 and S2 which are controlled by a polarity select signal applied to the terminal 24. Thus the moving contacts of the switches S1 and S2 contact either the fixed contacts 20 and 22 respectively or the fixed contacts 21 and 23 respectively. In the case of the switches S3 and S4, their moving contacts are either both up, that is connected to fixed contacts 25 and 27, respectively, or both down, that is connected to fixed contacts 26 and 28, respectively, on opposite half cycles of the clock signal applied to the terminal 32. The phasing of the clock signal is not important and its frequency should be greater than twice the frequency of the signal at the input terminal 18.

Figure 2A:
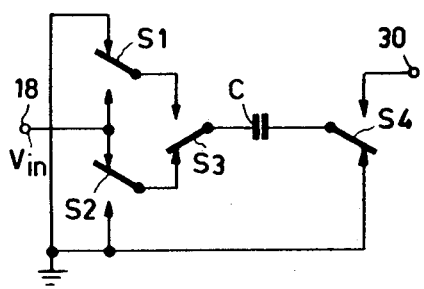
FIGS. 2A and 2B illustrate schematically the inverter in the invert mode on respective half cycles of the clock signal.
Figure 2B:
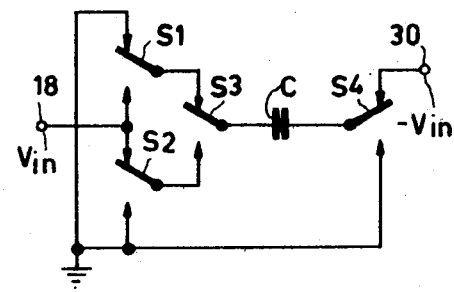

FIGS. 2A and 2B illustrate the switch positions of the switches S3 and S4 when the switches S1 and S2 are set for the invert mode, that is S1 is connected to ground and S2 is connected to the input terminal 18. When the moving contacts of the switches S3 and S4 are down (FIG. 2A) then the capacitor C is charged by the voltage $V_{in}$ on the input terminal 18 and the output terminal 30 is floating. On the following half cycle of the clock signal, the moving contacts of the switches S3 and S4 are both up, so that the capacitor C is connected by the switch S1 to ground and by the switch S4 to the output terminal 30 so that a voltage $-V_{in}$ is developed on the output terminal (FIG. 2B). The clocking of the switches S3, S4 enables the input voltage $V_{in}$ to be pumped to the output terminal 30 which gradually moves towards $-V_{in}$ over a number of clock cycles.

Figure 3A:
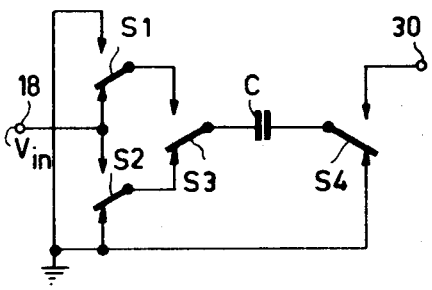
FIGS. 3A and 3B illustrate schematically the inverter in the noninvert mode on respective half cycles of the clock signal.
Figure 3B:
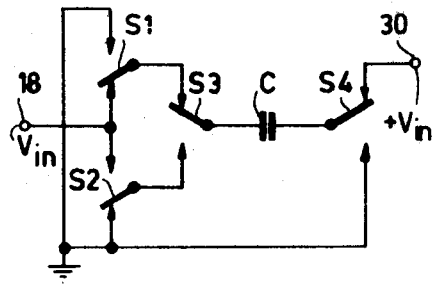

In the noninvert mode of the inverter 16, the moving contacts of the switches S1 and S2 are connected respectively to the input terminal 18 and to ground. When the switches S3 and S4 are down (FIG. 3A) then both sides of the capacitor C are connected to ground, and the output terminal 30 is floating. However, when switches S3 and S4 are both up (FIG. 3B) then the capacitor C is connected between the input and output terminals 18 and 30, and the output voltage moves gradually to $+V_{in}$ due to the pumping action of the switches S3 and S4.

In a practical application of the inverter circuit, the clock frequency ($f_c$) may be much higher, say 512 kHz, compared with the frequency, say 3.4 kHz, of the signal at the input terminal 18 so that the effective output resistance of the inverter 16 is $1/f_c C$. This can be advantageous if the input signal has to be filtered because the inverter 16 may act as a resistor in an RC filter. Consequently, the inverter 16 can act as an interface between a DAC and a low pass filter.

Figure 4:
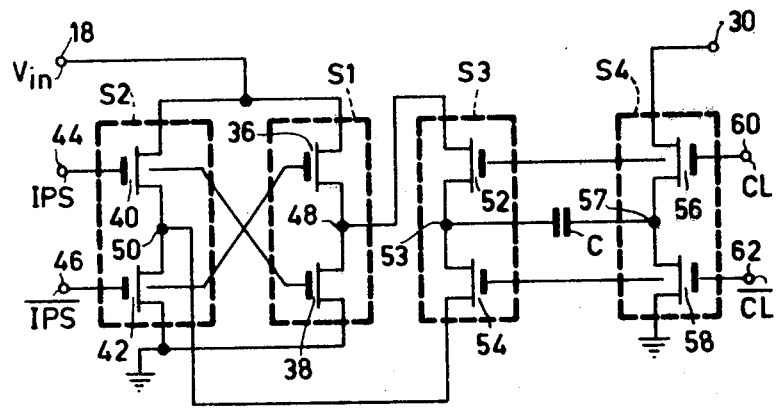
FIG. 4 illustrates an implementation of the inverter shown in FIG. 1 using field effect transistors (FETs) as switching elements.

FIG. 4 shows an implementation of the embodiment shown in FIG. 1 in which the change-over switches S1 to S4 comprise pairs of FETs, for example enhancement mode MOS transistors, whose source-drain paths are connected in series. The transistors are all of the same conductivity type, either p- or n-channel.

In the case of the switches S1 and S2, these comprise, respectively, transistors 36 and 38 and transistors 40 and 42, whose source-drain paths are connected in series between the input terminal 18 and ground. The gates of the transistors 38 and 40 are connected to a terminal 44, to which an invert polarity signal, $\overline{IPS}$, is applied as necessary. The gates of the transistors 36 and 42 are connected to a terminal 46 to which a noninvert polarity signal, IPS, is applied. The source-drain paths of the transistors 52 and 54 forming the third switch S3 are connected in series between a junction 48 of the source-drain paths of the transistors 36, 38 and a junction 50 of the source-drain paths of the transistors 40, 42. The switch S4 comprises transistors 56, 58 whose source-drain paths are connected in series between the output terminal 30 and ground. The capacitor C is connected between the junctions 53 and 57 of the source-drain paths of the transistors 52, 54 and 56, 58, respectively. The gates of the transistors 52, 56 are connected to a clock CL terminal 60 and the gates of the transistors 54, 58 are connected to an inverted clock, $\overline{CL}$, terminal 62.

The operation of the inverter shown in FIG. 4 is similar to that described with reference to FIGS. 2A, 2B, 3A and 3C. With the IPS signal high and the $\overline{IPS}$ signal low, transistors 38 and 40 will be conductive and the transistors 36 and 42 will be nonconductive. Then when the clock $\overline{CL}$ is low, CL is high so that the capacitor C is charged to $V_{in}$ via the transistors 40 and 54 while the output terminal 30 is floating—this is analogous to FIG. 2A. On the next half cycle of the clock signal the transistors 52, 56 are conductive while the transistors 54, 58 are nonconductive, thus one side of the capacitor C is connected to ground via the transistors 52 and 38, while the other side is connected to the output terminal 30 via the nonconductive transistor 56 so that a voltage moving gradually to $-V_{in}$ appears on the terminal 30—this corresponds to FIG. 2B.

Conversely, with the $\overline{\text{IPS}}$ signal high and the IPS signal low, the transistors 36 and 42 are conductive and the transistors 38, 40 will be nonconductive. When the CL signal is high and the $\overline{\text{CL}}$ signal is low then both sides of the capacitor C are connected to ground via the transistors 54 and 42 on the one hand and the transistor 58 on the other hand—this is analogous to FIG. 3A. On the next half cycle of the clock signal $\overline{\text{CL}}$ is high and CL is low so that the capacitor is connected to the input signal terminal 18 via the transistors 52 and 36 and to the output terminal 30 via the transistor 56 and the voltage thereon moves towards $V_{in}$—this corresponds to the situation shown in FIG. 3B.

Figure 5:
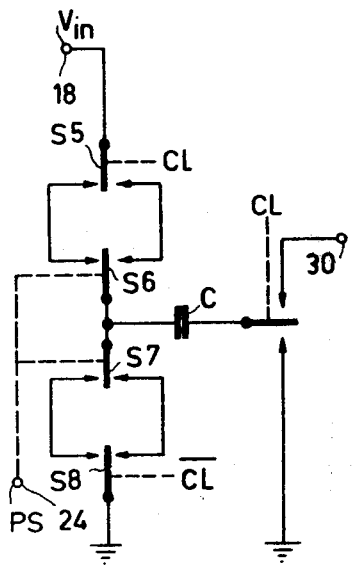
FIG. 5 is a diagram showing a second embodiment of the switchable analog signal inverter made in accordance with the present invention.

FIG. 5 is a diagram of another embodiment of an inverter made in accordance with the present invention. Wherever appropriate the same reference numerals have to be used to indentify the same components as in FIGS. 1 to 4.

The selective reversing of the phasing of the switching between the input signal voltage and the reference voltage (ground) applied to the input side of the capacitor C is realized by change-over switches S5, S6, S7 and S8 connected between the input terminal 18 and ground. The moving contact of the switch S5 is connected to the input terminal. The switch S5 is operated at clock frequency. The fixed contacts of the switch S5 are connected to corresponding fixed contacts of the switch S6 whose moving contact is connected to that of the switch S7 and to the input side of the capacitor C. The fixed contacts of the switch S7 are connected to corresponding fixed contacts of the switch S8 whose moving contact is connected to ground. The moving contacts of the switches S6 and S7 are operated in response to a polarity select signal applied to the terminal 24. The moving contact of the switch S8 is operated at clock frequency and in opposite phase to the moving contact of the switch S5. The switch S4 is connected as shown in FIG. 1 and accordingly will not be described again.

In order to understand the operation of the inverter shown in FIG. 5 it should be assumed that when the CL signal is high, then the moving contacts of the switches S5 and S8 are moved to the right and left respectively and that of the switch S4 is moved upwards in FIG. 5, and when $\overline{\text{CL}}$ is high then these moving contacts adopt their opposite positions. With the moving contacts of the switches S6 and S7 deflected to the left hand positions then when $\overline{\text{CL}}$ is high, the output terminal 30 is floating and when CL is high then the output terminal 30 moves gradually to $-V_{in}$. In the opposite positions of the moving contacts of the switches S6 and S7, when CL is high, the output terminal 30 is floating and when CL is high the output terminal 30 moves gradually towards $+V_{in}$.

Figure 6:
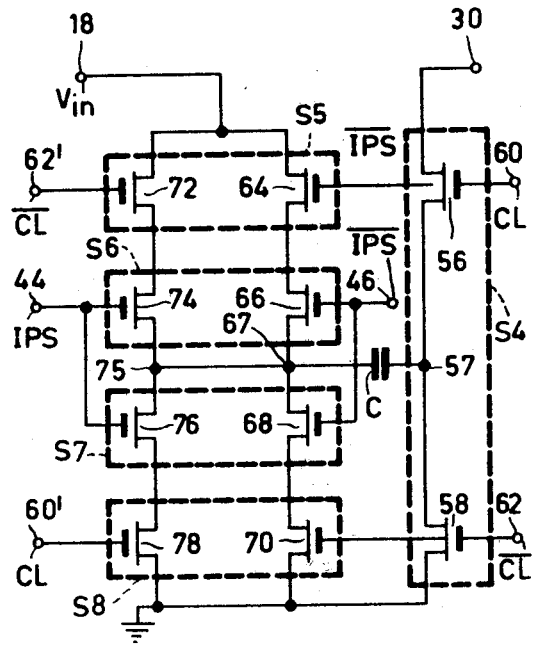
FIG. 6 shows an implementation of the inverter shown in FIG. 5 using FETs as switching elements.

The embodiment shown in FIG. 6 is an implementation of FIG. 5 using field effect transistors as switches.

For ease of description, the inverter shown in FIG. 6 may be regarded as comprising three branches, the first and second branches each comprising four transistors whose source-drain paths are connected in series between the input terminal 18 and ground, and the third branch comprising the transistors 56, 58 of the switch S4 whose source-drain paths are connected in series between the output terminal 30 and ground.

The first branch comprises the transistors 64, 66, 68 and 70 each comprising a part of the switches S5 to S8, respectively. The source-drain paths of these transistors are connected in series between the input terminal 18 and ground. The second branch comprises the transistors 72, 74, 76 and 78, each comprising the other part of the switches S5 to S8, respectively. The source-drain paths of these transistors are also connected between the input terminal and ground. Junctions 67 and 75 of the source-drain paths of the transistors 66, 68 and 74, 76 respectively are connected to one side of the capacitor C while its other side is connected to the junction 57. The gates of the transistors 66, 68 are connected to the IPS input 46, those of the transistors 74, 76 are connected to the $\overline{\text{IPS}}$ input 44, those of the transistors 56 and 64 and the transistor 78 to the CL inputs 60 and 60' respectively and those of the transistors 58 and 70 and the transistor 72 to the $\overline{\text{CL}}$ inputs 62 and 62' respectively.

The operation of the circuit of FIG. 6 can be readily understood from the description of FIG. 5. However, for the sake of completeness a tabular summary will be given below in which H means high, L means low and F means that the output terminal 30 is floating.

| $\overline{\text{IPS}}$ | L | L | H | H |
| --- | --- | --- | --- | --- |
| IPS | H | H | L | L |
| $\overline{\text{CL}}$ | H | L | H | L |
| CL | L | H | L | H |
| Terminal 30 | F | $-V_{in}$ | F | $+V_{in}$ |

One difference between the embodiments of FIGS. 4 and 6 is that the latter has two additional transistors, which means additional chip area is required if the inverter is fabricated as an integrated circuit.

In a typical integrated circuit of the switchable analog signal inverter the MOS transistors may be 5 microns $(\mu m) \times 4$ $\mu m$ and the capacitor C may be fabricated as an oxide capacitor of $50 \times 50$ $\mu m^2$ and have a capacitance of 1 pF. The clock signal swings between $-5$ V and $+5$ at a frequency of typically 128 kHz, 256 kHz or 512 kHz. The polarity select signal is switched between 0 and $+5$ volts. The analog input voltage $V_{in}$ varies in the range 0 to $+2.5$ volts at audio frequencies of say 300 Hz to 3.4 kHz. The output resistance of the inverter is of the order of 4M$\Omega$.

Although the circuits of FIGS. 4 and 6 have been described as using enhancement FETs, other FETs may be used provided that the clock swing exceeds the analog voltage switch $V_{out}$ so that the FETs can turn on and off. Similarly, the voltage swing on IPS and $\overline{\text{IPS}}$ must exceed the analog voltage swing on $V_{in}$.

I claim:

1. A switchable analog signal inverter comprising a single capacitance having a first side alternately switchable at a clock frequency between a reference voltage point and an output and a second side alternately switchable at the clock frequency between the reference voltage point and an input to which a single polarity voltage is applied, and switching means responsive to a polarity select signal for selectively determining the phasing of the switching between the reference voltage point and input and thereby the polarity of the voltage at the output.

2. An inverter as claimed in claim 1, wherein said switching means comprises a double pole reversing switch having inputs connected to the input and to the reference voltage point and first and second outputs, the second side of the capacitance is switchable between said first and second outputs on alternate half cycles of the clock frequency signal and the first side of the capacitance is switchable between the output and the reference voltage point on alternate half cycles of the clock signal, the reversing switch being operable in response to the polarity select signal to reverse the signals on the first and second outputs to determine the polarity of the voltage appearing on the output terminal.

3. An inverter as claimed in claim 1, wherein the second side of the capacitance is connected to the junction of the outputs of first and second change-over switches which are operable in response to a polarity select signal, the inputs of the first switch being connectable via a third change-over switch operable at a clock frequency to the input terminal and the inputs of the second switch being connectable via a fourth change-over switch operable at the clock frequency to the reference voltage point.

4. An inverter as claimed in claim 3, wherein the third, first, second and fourth change-over switches comprise a first branch of first, second, third and fourth FETs having their source-drain paths connected in series between the input terminal and the reference voltage point and a second branch of fifth, sixth, seventh and eighth FETs whose source-drain paths are connected in series between the input terminal and the reference voltage point, the second side of the capacitance is connected to the junctions of the source-drain paths of the second and third FETs and of the sixth and seventh FETs, the gates of the second and third FETs are connected to a first polarity select signal input, and the gates of the sixth and seventh FETs are connected to a second, opposite polarity select signal input, the first and eighth FETs being operable in response to one half-cycle of the clock signal and the fourth and fifth FETs being operable in response to the other half-cycle of the clock signal.

5. A switchable analog signal inverter comprising an input terminal for an analog voltage signal, an output terminal, a reference voltage point, a single capacitance, and first, second, third and fourth switching means, the first and second switching means being responsive to a polarity select signal to connect either the first switching means to the input terminal and the second switching means to the reference voltage point or the first switching means to the reference voltage point and the second switching means to the input terminal, the third switching means being connected to the capacitance and being operable on each half cycle of a clock frequency to connect alternately an output of the first and second switching means to the capacitance and the fourth switching means being operable at the clock frequency to connect the capacitance alternately to the output terminal and the point of reference potential.

6. An inverter as claimed in claim 5, wherein the first, second, third and fourth switching means comprise semiconductor switching devices.

7. An inverter as claimed in claim 5, wherein the first, second, third and fourth switching means comprise field effect transistors (FETs).

8. An inverter as claimed in claim 5, wherein the first and second switching means each comprise first and second FETs whose source-drain paths are connected in series between the input terminal and the reference voltage point, the gates of the first FET of the first switching means and the second FET of the second switching means being connected to one polarity select signal input, the gates of the second FET of the first switching means and the first FET of the second switching means being connected to another polarity select signal input; the third switching means comprises first and second FETs whose source-drain paths are connected in series between a junction of the source-drain paths of the FETs of the first switching means and a junction of the source-drain paths of the FETs of the second switching means; the fourth switching means comprises first and second FETs whose source-drain paths are connected in series between the output terminal and the reference voltage point, the capacitance being connected between the junctions of the source-drain paths of the FETs of the third and fourth switching means, the gates of the first transistors of the third and fourth switching means being operable on one half cycle of a clock signal and the gates of the second transistors of the third and fourth switching means being operable on the other half cycle of the clock signal.

9. The combination of a switchable analog signal inverter as claimed in claim 1, 2, 3, 4, 5, 6, 7 or 8 and a digital to analog converter, the output of said digital to analog converter being connected to the input of said switchable analog signal inverter.

* * * * *